(12) United States Patent
Bernier et al.

(10) Patent No.: US 11,686,693 B2
(45) Date of Patent: Jun. 27, 2023

(54) ELECTRON MICROSCOPY ANALYSIS METHOD

(71) Applicant: Commissariat à l'Energie Atomique et aux Energies Alternatives, Paris (FR)

(72) Inventors: Nicolas Bernier, Grenoble (FR); Loïc Henry, Saint-Maximin-la-Sainte-Baume (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 395 days.

(21) Appl. No.: 16/946,782

(22) Filed: Jul. 6, 2020

(65) Prior Publication Data

US 2021/0010956 A1    Jan. 14, 2021

(30) Foreign Application Priority Data

Jul. 8, 2019  (FR) ...................................... 1907615

(51) Int. Cl.
*G01N 23/20058*  (2018.01)
*G01N 23/2252*   (2018.01)
*G01N 23/2055*   (2018.01)

(52) U.S. Cl.
CPC ... *G01N 23/20058* (2013.01); *G01N 23/2055* (2013.01); *G01N 23/2252* (2013.01); *G01N 2223/071* (2013.01); *G01N 2223/41* (2013.01); *G01N 2223/605* (2013.01)

(58) Field of Classification Search
CPC ......... G01N 23/20058; G01N 23/2252; G01N 23/2055; G01N 2223/071; G01N 2223/41; G01N 2223/605; G01N 2223/056; G01N 2223/102; G03H 1/0443; G03H 5/00; G03H 2001/0447; H01J 37/26; H01J 37/28; H01J 2237/1505; H01J 2237/2802; H01J 2237/2804; H01J 2237/2807
USPC ................................ 250/311, 310, 306, 307
See application file for complete search history.

(56) References Cited

U.S. PATENT DOCUMENTS

| | | | |
|---|---|---|---|
| 6,835,931 B2 | 12/2004 | Wright et al. | |
| 2008/0027256 A1* | 1/2008 | Roth | C07C 2/66 585/653 |
| 2011/0220796 A1* | 9/2011 | Nicolopoulos | H01J 37/28 250/311 |
| 2015/0076346 A1* | 3/2015 | Weiss | G01N 23/2251 250/307 |

FOREIGN PATENT DOCUMENTS

WO    2018173491 A1    9/2018

OTHER PUBLICATIONS

Preliminary Search Report for French Application No. 1907615 dated Mar. 26, 2020, 2 pages.
(Continued)

*Primary Examiner* — Kiet T Nguyen
(74) *Attorney, Agent, or Firm* — Moreno IP Law LLC

(57) ABSTRACT

The present disclosure concerns an electron microscopy method, including the emission of a precessing electron beam and the acquisition, at least partly simultaneous, of an electron diffraction pattern and of intensity values of X rays.

14 Claims, 3 Drawing Sheets

(56) References Cited

OTHER PUBLICATIONS

Rauch, E.F., et al., "Automated nanocrystal orientation and phase mapping in the transmission electron microscope on the basis of precession electron diffraction," Zeitschrift für Kristallographie International journal for structural, physical, and chemical aspects of crystalline materials, No. 225 (2010), pp. 103-109.

Vincent, R., et al., "Double conical beam-rocking system for measurement of integrated electron diffraction intensities," Ultramicroscopy, No. 53 (1994), pp. 271-282.

Liao, Y., et al., "Reduction of electron channeling in EDS using precession," Ultramicroscopy, No. 126 (2013), pp. 19-22.

\* cited by examiner

ELECTRON MICROSCOPY ANALYSIS METHOD

FIELD

The present disclosure generally concerns electron microscopy, and more particularly a method of analysis of an object by electron microscopy.

BACKGROUND

Electron microscopy is used to analyze various objects such as structures present in electronic components. Examples of electronic components are phase-change memory cells, or components comprising a plurality of materials, for example, semiconductors. An electron beam is successively focused on various points of the observed object. The analysis may be a chemical analysis. The analysis may also be of crystallographic type.

SUMMARY

An embodiment overcomes all or part of the disadvantages of known methods of crystallographic analysis by electron microscopy.

An embodiment overcomes all or part of the disadvantages of known methods of chemical analysis by electron microscopy.

An embodiment provides a method of chemical and crystallographic analysis of an object which changes or moves during the analysis.

An embodiment provides a particularly accurate method of chemical and crystallographic analysis.

Thus, an embodiment provides an electron microscopy method, comprising the emission of a precessing electron beam and the acquisition, at least partly simultaneous, of an electron diffraction pattern and of intensity values of X rays.

According to an embodiment, during said acquisition, the electron beam has an axis running through a point of an object.

According to an embodiment, the method comprises a step among:
the determination that said point is located in an amorphous portion; and
the determination that said point is located in a crystalline portion.

According to an embodiment, said point corresponds to a pixel among pixels of an image.

According to an embodiment, the method comprises, for each of the pixels of at least one set of pixels of the image associated with an amorphous phase, the determination of a chemical composition based on said intensity values.

According to an embodiment, the method comprises, for each of the pixels of at least one set of pixels of the image associated with a same crystalline phase, the determination of a chemical composition based on said intensity values.

According to an embodiment, the method comprises the determination of the structure of said same crystalline phase and/or of one or a plurality of parameters of said same crystalline phase and/or of a crystal orientation.

According to an embodiment, the method comprises the determination of at least one deformation value based on the chemical composition and on said one or a plurality of parameters of said same crystalline phase.

According to an embodiment, the method comprises, for said set, the determination of a statistic chemical composition value associated with the pixels of said set.

According to an embodiment, the precessional motion has a same angle and a same frequency for all the pixels of the image.

According to an embodiment, the precessional motion has a half-angle at the apex which is positive and smaller than 10 degrees.

According to an embodiment, the precession frequency is in the range from 0.2 Hz to 1,000 Hz.

Another embodiment provides an electron microscope, configured to implement a method such as defined hereinabove.

According to an embodiment, the microscope is a transmission or scanning microscope.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Throughout the present disclosure, the term "connected" is used to designate a direct electrical connection between circuit elements, whereas the term "coupled" is used to designate an electrical connection between circuit elements that may be direct, or may be via one or more intermediate elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
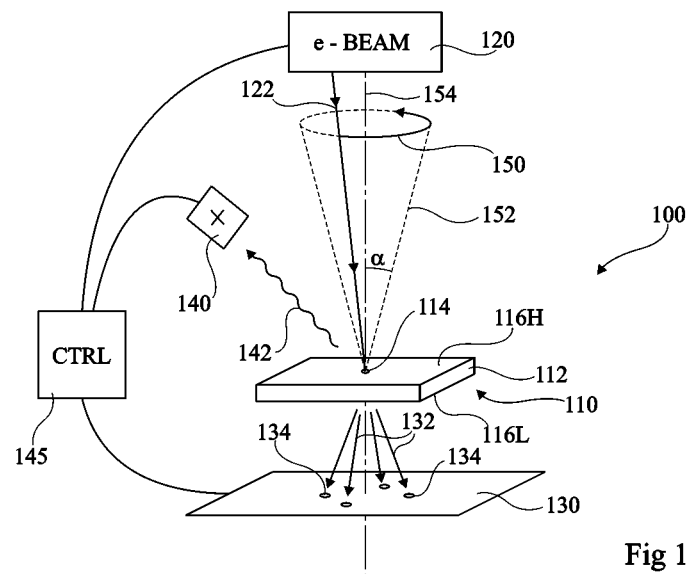
FIG. 1 is a perspective view partially showing an electron microscope configured to implement a method according to an embodiment.

FIG. 1 is a perspective view partially showing an electron microscope 100 configured to implement a method according to an embodiment.

Microscope 100 comprises a location 110 intended to receive an object to be observed 112. As an example, the object to be observed 112 at least partly has the shape of a plate having opposite main surfaces 116H and 116L.

Electron microscope 100 further comprises an electron beam (e-BEAM) generator 120. In operation, generator 120 emits an electron beam 122 towards the object to be observed. The electrons typically have an energy level greater than 30 keV, preferably greater than 100 keV. Generator 120 is not described in detail, the described embodiments being compatible with usual generators of electron beams of an electron microscope.

Preferably, electron microscope 100 is a transmission microscope. The object to be observed is in this case sufficiently thin to be crossed by some of the electrons of the beam, preferably more than half of the electrons of the beam. The described embodiments are compatible with usual thicknesses of objects to be observed by transmission electron microscopy. Electron microscope 100 is then capable of detecting electrons which have crossed the object. As a variant, the electron microscope is a scanning electron microscope, that is, capable of detecting electrons reflected by the object, and preferably equipped with a detector capable of imaging the electrons which have crossed the object.

Beam 122 has an axis running through a point 114 of object 112, and beam 122 is preferably focused on a point of this axis. For example, point 114 is a focusing point of the electron beam. In other words, an area of arrival on object 112 of substantially all, for example, all, the electrons in the beam is centered around point 114. This area is for example on surface 116H of object 112. This area is for example contained within a circle having a diameter smaller than 10 nm, preferably smaller than 5 nm.

Microscope 100 further comprises a diffraction pattern acquisition device 130. More particularly, device 130 is configured to provide, or acquire and record, a diffraction pattern of electrons diffracted 132 by the interaction of beam 122 with object 112. Preferably, diffraction pattern acquisition device 130 is located on the side of object 112 opposite to the side of arrival of beam 122, that is, in the shown example, on the side of surface 116L of object 112. In the case where the beam is focused on point 114, the diffraction pattern preferably is an image having each pixel corresponding to a diffraction direction from point 114. In other words, for each pixel, a number of electrons diffracted in a given direction is recorded. Although the beam is preferably focused on point 114, this is not limiting, and beam 122 may have a focusing plane different from surface 116H. Device 130 is not described in detail, the described embodiments being compatible with usual devices capable of obtaining electron diffraction patterns. As an example, device 130 comprises a camera of charged-coupled device, CCD, type.

Microscope 100 further comprises an X-ray detector 140, capable of delivering intensity values of X rays 142 emitted by the interaction of electron beam 122 with object 112. Each of the values delivered by the detector is representative of an intensity of the X-rays for a given energy of the X-rays. The X-rays are defined by electromagnetic radiations having an energy in the range from 13.6 eV to 300 keV. As an example, the supplied values form an energy spectrum, that is, form a set of intensity values according to the energy in a given range of energies. As a variant, only some of the values of the energy spectrum are supplied by the detector.

Microscope 100 further comprises a control unit 145 (CTRL) coupled, preferably connected, to electron beam (or electronic beam) generator 120, to diffraction pattern acquisition device 130, and to X-ray detector 140. Control unit 145 preferably comprises a data processing unit, such as one or a plurality of microprocessors, and a memory. The memory contains a program executable by the microprocessor.

The execution of the program by the processing unit implements a method where:
  the electron beam has a precessional motion 150; and
  periods of acquisition of an electron diffraction pattern and of intensity values of the X rays are at least partly simultaneous.

Precessional motion 150 is defined by a motion during which the axis of beam 122 follows a cone 152, preferably a circular cone. Cone 152 has an axis 154 and has point 114 as an apex. Axis 154 preferably corresponds to the optical axis of the microscope, for example, orthogonal to surface 116H. Preferably, cone 152 has a positive non-zero half-angle at the apex α, which is at most equal to 10 degrees. Preferably, the precessional motion has a frequency in the range from 0.2 to 1,000 Hz.

The period of acquisition of the diffraction pattern is defined by the period during which device 130 receives the diffracted electrons 132 used to form the diffraction pattern. The recorded/obtained diffraction pattern is formed of disks, of rings, or of points 134. Preferably, device 130 is placed at a sufficient distance from object 112 to cover a sufficient number of diffracted beams, which may take the form of points, disks, or rings.

The period of acquisition of the intensity values of the X rays is defined by the period during which detector 140 receives the X rays used to obtain these intensity values.

Preferably, a chemical and crystallographic analysis of the portion of object 112 having interacted with beam 122 is performed based on the diffraction pattern and on the X-ray intensity values.

More particularly, the crystallographic analysis may comprise determining whether the portion of object 112 which has interacted with beam 122 is amorphous, or whether this portion is crystalline, that is, formed of one or a plurality of crystals. The crystallographic analysis may comprise determining the crystalline structure and the orientation of the crystal lattice in the portion of object 112 which has interacted with beam 122.

More particularly, the chemical analysis may comprise determining the chemical composition of the portion of object 112 having interacted with beam 122. The chemical analysis may also comprise determining contents of expected chemical elements.

To perform a crystallographic and chemical analysis of a portion of an object, it could have been devised to successively obtain an X-ray spectrum and a diffraction pattern. However, it is current for the object to displace or to change. In particular, the electron beam modifies various structural and/or chemical properties of the analyzed portion. Further, objects such as growing crystals or phase-change material may be changing. Further, vibrations or various thermal phenomena, in particular linked to the beam, are often the source of displacements of the portion to be analyzed. Such displacements or such an evolution would have resulted in an inaccuracy in the results of the chemical and crystallographic analyses. Motions of the beam, such as the precessional motion, would not have enabled to improve such an accuracy problem.

As a comparison with an analysis by successive acquisitions of an energy spectrum and of a diffraction pattern, the simultaneity between the precessional motion, the acquisition of the diffraction pattern, and the acquisition of values of the energy spectrum results in a more accurate analysis, even when object 112 displaces or changes.

Figure 2:
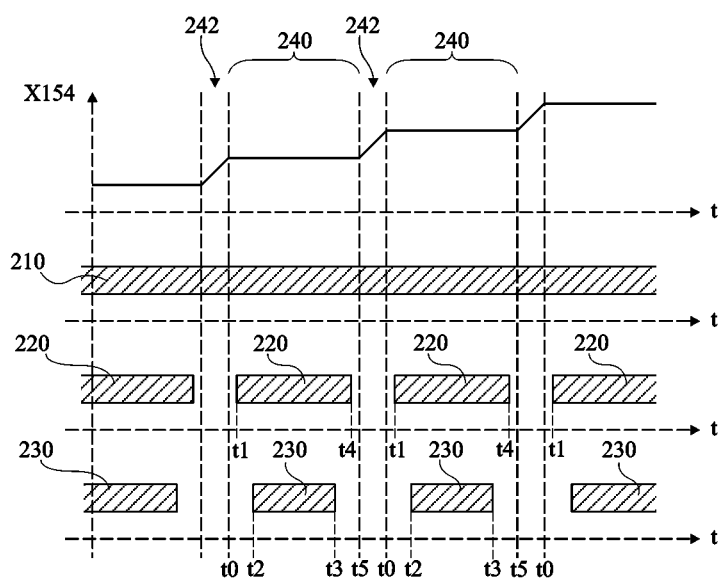
FIG. 2 is a timing diagram showing an example of a method implemented by the electron microscope of FIG. 1.

FIG. 2 is a timing diagram showing an example of a method implemented by the electron microscope of FIG. 1. More particularly, FIG. 2 illustrates, over time, the position X154 of axis 154 of the precession cone, a period 210 during which the beam is precessing 150, periods 220 of diffraction pattern acquisition, and periods 230 of acquisition of X-ray intensity values.

Position X154 corresponds to the position of point 114 of object 112. The method comprises phases 240 during which position X154 is fixed. Phases 240 alternate with phases 242. During each phase 242, the beam is displaced from the fixed position X154 of the previous phase 240 to the fixed position X154 of the next phase 240. Preferably, the duration of each phase 240 in a fixed position is greater than 0.1 s, for example, in the range from 0.5 s to 5 s. The duration of each displacement phase 242 is preferably shorter than 10 ms, more preferably shorter than 1 ms. As a variant, the beam is instantaneously displaced.

Preferably, the beam is emitted and precesses all along phases 240 and all along phases 242. The precessional motion preferably has the same half-angle at the apex and the same frequency for all phases 240.

Each of the phases 240 with a fixed position of the beam starts at a time t0. Diffraction pattern acquisition device 130 is initialized at a time t1, equal or subsequent to time t0.

In each phase 240, between times t2 and t3, detector 140 determines intensity values of the X rays. Then, average intensity values corresponding to the average of the intensity values of the X rays between times t2 and t3 are calculated. For this purpose, as an example, detector 140 remains in operation during all phases 240 and 242, and the determined values result from a difference between cumulated intensity values measured at times t3 and t2. As a variant, detector 140 is initialized at time t2.

At a time t4 device 130 ends the acquisition of the diffraction pattern. Phase 240 ends at a time t5, equal or subsequent to time t4.

In each of phases 240, the acquisitions of the diffraction pattern and of the intensity values of the X rays are at least partly simultaneous, that is, at least a portion of periods 220 and 230 occurs at the same time. In other words:

time t2 of beginning of period 230 of acquisition of the intensity values of the X rays comes sooner than time t4 of end of period 220 of acquisition of the diffraction pattern; and time t3 of end of period 230 of acquisition of the X-ray intensity values is subsequent to time t1 of beginning of period 220 of acquisition of the diffraction pattern.

Preferably, period 230 of acquisition of the intensity values of X rays entirely occurs during period 220 of acquisition of the diffraction pattern. In other words, times t1, t2, t3, t4, and t5 follow one another in this order.

The diffraction pattern acquired during period 220 is used at a subsequent step, not shown. As an example, if the diffraction pattern is not that of an amorphous material, a set of Miller indices is associated with each of the disks or rings or points 134. This enables to identify a crystalline state, for example, to characterize the crystalline structure. Parameters of the crystalline structure, for example, mesh parameters, as well as the orientation of the crystalline structure, can be deduced from the positions of the disks or rings or points 134 in the diffraction pattern. The embodiments are compatible with usual methods of analysis of a crystalline structure and/or of the orientation thereof based on a diffraction pattern. In the diffraction pattern acquired during period 220, the disks or rings or points 134 (FIG. 1) resulting from the precessional motion enable to analyze the crystalline structure more accurately than in the absence of a precessional motion.

The intensity values of the X rays acquired during phase 230 are for predefined energy values of the X rays. The predefined energy values may be distributed in an energy range. The X rays have intensity peaks at energies depending on the chemical composition of the portion of the object which interacts with the beam. The energy range is selected to contain the energies of such intensity peaks. As an example, the energy range is in the range from 0.1 keV to 20 keV. For example, the predefined energy values are regularly distributed in the range with a pitch smaller than a width of the intensity peak. A chemical composition can then be deduced from the energy values acquired during period 230. The described embodiments are compatible with usual methods of analysis of the chemical composition based on the intensity values of X rays for different energies.

Preferably, the predefined energy values of the X rays are the energies for which the spectrum has peaks corresponding to chemical elements known in advance. This enables to decrease the quantity of information to be processed for the chemical analysis and thus to simplify the analysis. For example, contents, or percentages, of such elements known in advance are measured in the analyzed materials.

Figure 3:
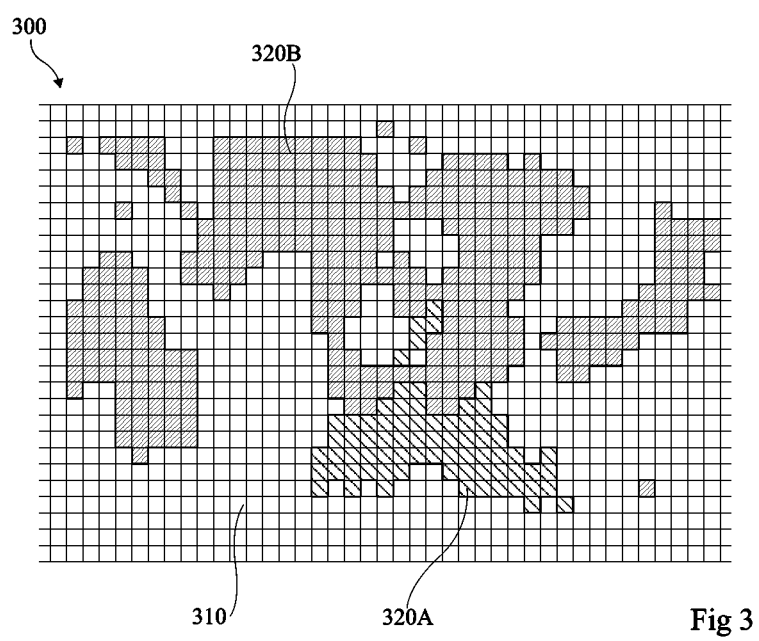
FIG. 3 shows an example of an image obtained by an example of the method implemented by the electron microscope of FIG. 1.

FIG. 3 shows an example of an image 300 obtained by an example of the method implemented by the electron microscope of FIG. 1.

More particularly, the method corresponds to that of FIG. 2, where each of the successive positions X154 of the precession axis of the beam is associated with a pixel of the image. Thus, each position X154 corresponds to a point 114 of the observed object 112. The image corresponds to the mapping of an area of interest of object 112. AS a variant, the area of interest is placed at the edge of the object, and only a portion of positions X154 correspond to points of the object.

The area of interest is selected prior to the implementation of the method. A step of calibration of the distances between successive positions X154, enabling to define the positions X154 arranged in an array in the entire area of interest, is then implemented.

In the shown example, the area of interest is comprised in a phase-change material of a memory cell. Such a cell is programmed by making an initially crystalline portion of the phase-change material amorphous. The reading of the information contained in the memory cell is based on an electric conductivity difference between the crystalline and amorphous states. The phase-change material here is made up of germanium, antimony, and tellurium.

Sets 320A, 302B of pixels 310 of image 300 are defined. Sets 320A and 320B are shown in FIG. 3 by different hatchings. The shown example of two sets is not limiting, and the number of sets may be smaller or greater than two. The pixels of set 320A correspond to the points 114 (FIG. 1) located in an amorphous region of the object, that is, in an amorphous phase. The pixels of set 320B correspond to the positions of points 114 where the object has a same crystalline state, that is, has a same crystalline structure. In other words, the pixels of set 320B correspond to a crystal region where the object has a same crystalline phase. The crystalline structure corresponding to set 320B may be polycrystalline, that is, comprise a plurality of crystal orientations. As a variant, sets 320A, 320B having their pixels corresponding to different crystalline structures are defined, which enables to visualize the crystals. As a second variant, each set 320A, 320B is defined by the pixels corresponding to a same crystalline state with different crystal orientations. The pixels of each set 320A, 320B may be contiguous or not.

The composition of each set is then determined. As an example, an average composition of the phase corresponding to this set is defined. Similarly, any statistical value such as the average, the minimum, the maximum, or the standard deviation of the content of one or a plurality of the chemical elements forming the phase corresponding to the set may be determined.

For each set, the state has thus been determined among amorphous and crystalline states, and the amorphous phase or the crystalline phase has been analyzed. The simultaneity between the precessional motion, the acquisition of the diffraction pattern, and the acquisition of values of the energy spectrum enables to avoid that, after a displacement, a deformation, or a change, the chemical elements present around the analyzed phase have an influence upon the results of the crystallographic analysis.

Figure 4:
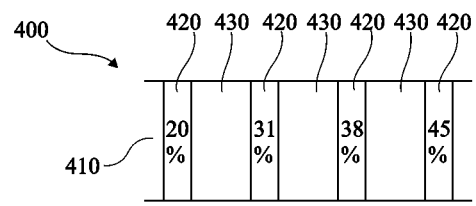
FIG. 4 shows an example of a structure analyzed in an example of a method implemented by the electron microscope of FIG. 1.

FIG. 4 shows an example of an object 400 analyzed in an example of the method of FIG. 2.

Object 400 is for example a structure obtained by epitaxy of alternated structure 420 and 430 respectively made of silicon-germanium and of silicon, on a single-crystal silicon region 410. As an example, structure 400 comprises four silicon-germanium layers 420. Layers 420 are thinner than silicon layers 430. Silicon-germanium layers 420 have a thickness in the order of 15 nm. The crystal lattices, more particularly the crystal lattices of layers 420, are deformed due to the lattice mismatch between the silicon and the silicon-germanium. Layers 420 comprise germanium contents respectively equal to 20%, 31%, 38%, and 45% (starting from region 410).

Figure 5:
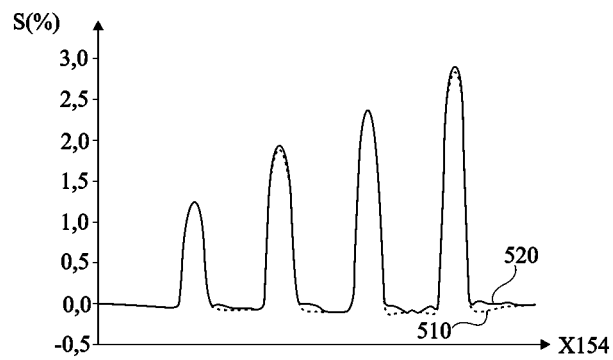
FIG. 5 shows, according to a position, deformations of the structure of FIG. 4, obtained by an example of the method implemented by the electron microscope of FIG. 1.

FIG. 5 shows, according to position X154 (FIG. 2), deformations S, in percent (%), of the structure of FIG. 4, obtained by an example of the method of FIG. 2. More particularly, for each position X154, the deformation values 510 calculated from the chemical composition determined by the analysis according to the method have been shown in dotted lines and the deformation values 520 obtained from the lattice parameters determined by the analysis according to the method have been shown in full lines. Deformation values 510 and 520 differ by less than 0.1%.

Figure 6:
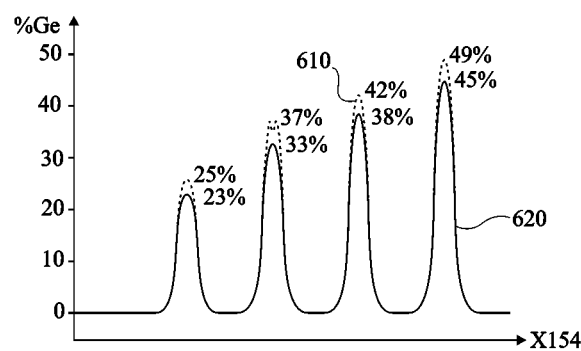
FIG. 6 shows, according to a position, chemical compositions of materials of the structure of FIG. 4, obtained by an example of the method implemented by the electron microscope of FIG. 1.

FIG. 6 shows chemical compositions of materials of the structure of FIG. 4, obtained by an example of the method of FIG. 2. More particularly, for each position X154, germanium content values (% Ge) obtained by a method with no precession have been shown in dotted lines, and content values 620 obtained by the method of FIG. 2 have been shown in full lines. The difference between the germanium contents of structure 400 and the maximum values measured with a precessional motions, respectively of 23%, 33%, 38%, and 45%, are smaller than 3%. Further, the maximum values measured with a precessional motion are more accurate than those, respectively of 25%, 37%, 42%, and 49% obtained with no precessional motion.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional indications provided hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electron microscopy method, comprising:
    emitting an electron beam having a precessional motion; and
    acquiring, at least partly simultaneously, an electron diffraction pattern and of intensity values of X rays.

2. The method according to claim 1, wherein, during the step of acquiring, the electron beam has an axis running through a point of an object.

3. The method according to claim 2, comprising a step among:
    determining that said point is located in an amorphous portion; and
    determining that said point is located in a crystalline portion.

4. The method according to claim 3, comprising, for each pixel of at least one set of pixels of an image associated with an amorphous phase, determining a chemical composition based on said intensity values of the X rays.

5. The method according to claim 4, comprising, for said set, determining a statistic chemical composition value associated with the pixels of said set.

6. The method according to claim 3, comprising, for each pixels of at least one set of pixels of an image associated with a same crystalline phase, determining a chemical composition based on said intensity values of the X rays.

7. The method according to claim 6, comprising determining a structure of said same crystalline phase and/or of one or a plurality of parameters of said same crystalline phase and/or of a crystal orientation.

8. The method according to claim 7, comprising determining at least one deformation value based on the chemical composition and on said one or a plurality of parameters of said same crystalline phase.

9. The method according to claim 2, wherein said point corresponds to a pixel among pixels of an image.

10. The method according to claim 9, wherein the precessional motion has a same angle and a same frequency for all the pixels of the image.

11. The method according to claim 1, wherein the precessional motion has a half-angle at the apex which is positive and smaller than 10 degrees.

12. The method according to claim 1, wherein a precession frequency is in the range from 0.2 Hz to 1,000 Hz.

13. An electron microscope configured to implement the method according to claim 1.

14. The microscope according to claim 13, wherein the electron microscope is a transmission or a scanning electron microscope.

* * * * *